(12) United States Patent
Suzuki et al.

(10) Patent No.: US 7,884,012 B2
(45) Date of Patent: *Feb. 8, 2011

(54) VOID-FREE COPPER FILLING OF RECESSED FEATURES FOR SEMICONDUCTOR DEVICES

(75) Inventors: Kenji Suzuki, Guilderland, NY (US); Tadahiro Ishizaka, Watervliet, NY (US); Miho Jomen, Watervliet, NY (US); Jonathan Rullan, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 714 days.

This patent is subject to a terminal disclaimer.

(21) Appl. No.: 11/864,566

(22) Filed: Sep. 28, 2007

(65) Prior Publication Data

US 2009/0087981 A1 Apr. 2, 2009

(51) Int. Cl.
  *H01L 21/4763* (2006.01)
(52) U.S. Cl. .................. 438/637; 438/627; 438/643; 438/650; 438/660; 257/E21.082; 257/E21.577; 257/E21.584; 257/E21.586
(58) Field of Classification Search ............ 438/618, 438/620, 627, 637, 650, 687, 628, 642, 643, 438/660, 686; 257/E21.577, E21.579, E21.582, 257/E21.584, E21.082, E21.586
See application file for complete search history.

(56) References Cited

U.S. PATENT DOCUMENTS

| 4,851,895 A | 7/1989 | Green et al. |
| 4,929,468 A | 5/1990 | Mullendore |
| 4,938,999 A | 7/1990 | Jenkin |

(Continued)

FOREIGN PATENT DOCUMENTS

CA 2206217 A1 11/1998

(Continued)

OTHER PUBLICATIONS

U.S. Patent and Trademark Office, Final Office Action received for related U.S. Appl. No. 11/693,298 dated Dec. 22, 2009, 21 pp.

(Continued)

*Primary Examiner*—Matthew C Landau
*Assistant Examiner*—Joseph C Nicely
(74) *Attorney, Agent, or Firm*—Wood, Herron & Evans, LLP

(57) ABSTRACT

A method is provided for void-free copper (Cu) filling of recessed features in a semiconductor device. The method includes providing a patterned substrate containing a recessed feature, depositing a barrier film on the patterned substrate, including in the recessed feature, depositing a Ru metal film on the barrier film, and depositing a discontinuous Cu seed layer on the Ru metal film, where the Cu seed layer partially covers the Ru metal film in the recessed feature. The method further includes exposing the substrate to an oxidation source gas that oxidizes the Cu seed layer and the portion of the Ru metal film not covered by the Cu seed layer, heat-treating the oxidized Cu seed layer and the oxidized Ru metal film under high vacuum conditions or in the presence of an inert gas to activate the oxidized Ru metal film for Cu plating, and filling the recessed feature with bulk Cu metal. The exposure to the oxidation source gas can be an air exposure commonly encountered in semiconductor device manufacturing prior to Cu plating.

20 Claims, 10 Drawing Sheets

U.S. PATENT DOCUMENTS

| | | | |
|---|---|---|---|
| 5,171,610 | A | 12/1992 | Liu |
| 5,372,849 | A | 12/1994 | McCormick et al. |
| 5,877,086 | A | 3/1999 | Aruga |
| 6,063,705 | A | 5/2000 | Vaartstra |
| 6,074,945 | A | 6/2000 | Vaartstra et al. |
| 6,077,780 | A | 6/2000 | Dubin |
| 6,232,230 | B1 | 5/2001 | Iacoponi |
| 6,242,349 | B1 | 6/2001 | Nogami et al. |
| 6,287,435 | B1 | 9/2001 | Drewery et al. |
| 6,303,809 | B1 | 10/2001 | Chi et al. |
| 6,319,832 | B1 | 11/2001 | Uhlenbrock et al. |
| 6,399,486 | B1 * | 6/2002 | Chen et al. ............... 438/660 |
| 6,420,583 | B1 | 7/2002 | Lienhard et al. |
| 6,440,495 | B1 | 8/2002 | Wade et al. |
| 6,440,854 | B1 | 8/2002 | Rozbicki |
| 6,444,263 | B1 | 9/2002 | Paranjpe et al. |
| 6,508,919 | B1 | 1/2003 | Licata et al. |
| 6,605,735 | B2 | 8/2003 | Kawano et al. |
| 6,627,542 | B1 | 9/2003 | Gandikota et al. |
| 6,713,373 | B1 | 3/2004 | Omstead |
| 6,989,321 | B2 | 1/2006 | Yamasaki et al. |
| 7,037,836 | B2 * | 5/2006 | Lee ....................... 438/687 |
| 7,107,998 | B2 * | 9/2006 | Greer et al. ............. 134/22.1 |
| 7,115,498 | B1 * | 10/2006 | Adem .................... 438/627 |
| 7,264,846 | B2 | 9/2007 | Chang et al. |
| 7,270,848 | B2 | 9/2007 | Suzuki et al. |
| 7,279,421 | B2 | 10/2007 | Suzuki |
| 7,285,308 | B2 | 10/2007 | Hendrix et al. |
| 7,288,479 | B2 | 10/2007 | Suzuki |
| 7,459,396 | B2 | 12/2008 | Suzuki et al. |
| 7,694,413 | B2 * | 4/2010 | Johnston et al. ............ 29/825 |
| 7,704,879 | B2 * | 4/2010 | Suzuki ................... 438/650 |
| 2003/0129306 | A1 | 7/2003 | Wade et al. |
| 2004/0241321 | A1 | 12/2004 | Ganguli et al. |
| 2005/0110142 | A1 | 5/2005 | Lane et al. |
| 2006/0113675 | A1 | 6/2006 | Chang et al. |
| 2006/0121733 | A1 | 6/2006 | Kilpela et al. |
| 2006/0131751 | A1 | 6/2006 | Minamihaba et al. |
| 2006/0199372 | A1 | 9/2006 | Chung et al. |
| 2006/0220248 | A1 | 10/2006 | Suzuki |
| 2006/0237800 | A1 * | 10/2006 | Rudeck ................... 257/384 |
| 2006/0240187 | A1 * | 10/2006 | Weidman ............... 427/248.1 |
| 2006/0258152 | A1 | 11/2006 | Haider |
| 2006/0273431 | A1 | 12/2006 | He et al. |
| 2007/0059502 | A1 * | 3/2007 | Wang et al. ............... 428/209 |
| 2007/0072415 | A1 * | 3/2007 | Suzuki .................... 438/652 |
| 2007/0099422 | A1 * | 5/2007 | Wijekoon et al. .......... 438/687 |
| 2007/0141735 | A1 | 6/2007 | Joo et al. |
| 2007/0281457 | A1 * | 12/2007 | Chu et al. ................. 438/597 |
| 2007/0284736 | A1 | 12/2007 | Yang et al. |
| 2008/0081464 | A1 | 4/2008 | Matsuda et al. |
| 2008/0237029 | A1 * | 10/2008 | Tang et al. ................. 204/164 |
| 2008/0264774 | A1 * | 10/2008 | Baskaran et al. ......... 204/192.1 |
| 2008/0284020 | A1 | 11/2008 | Ishizaka |
| 2009/0085211 | A1 | 4/2009 | Robison et al. |

FOREIGN PATENT DOCUMENTS

| | | |
|---|---|---|
| EP | 0620291 | 10/1994 |
| JP | 2004146516 A | 5/2004 |
| WO | 0012777 A1 | 3/2000 |
| WO | 0026432 | 5/2000 |
| WO | 2005034223 | 4/2005 |

OTHER PUBLICATIONS

Chen et al., Novel Post Electroplating in-situ Rapid Annealing Process for Advanced Copper interconnect Application, IEEE, 2000, pp. 194-196.

U.S. Patent and Trademark Office, Non-final Office Action received for related U.S. Appl. No. 11/864,960 dated Jul. 24, 2009, 30 pp.

U.S. Patent and Trademark Office, Non-final Office Action received for related U.S. Appl. No. 11/693,298 dated Apr. 13, 2009, 16 pp.

Czekaj, C. et al. Inorganic Chemistry (1988) No. 27, pp. 8-10.

Wang et al., Low-temperature chemical vapor deposition and scaling limit of ultrathin Ru films, Applied Physics Letters (Feb. 23, 2004) vol. 84, No. 8, pp. 1380-1382, American Institute of Physics, Melville, NY.

Boyd, Edwin P. et al., Chemical vapor deposition of metallic thin films using homonuclear and heteronuclear metal carbonyls, Chem. Mater. (1997) No. 9, pp. 1154-1158.

Green, M.L. et al., Chemical vapor deposition of ruthenium and ruthenium dioxide films, Journal of the Electrochemical Society, vol. 132, No. 11, pp. 2677-2685.

Cheng, Wei-Yuan et al., Initial growth of chemical-vapor-deposited Ru from bis(hexafluoroacetylacetonate) dicarbonyl ruthenium, Thin Solid Films 483 (2005) pp. 31-37.

Gatineau, Julien et al., Deposition of highly pure ruthenium thin films with a new metal-organic precursor, Surface and Coatings Technology 201 (2007), pp. 9146-9148.

Bykov, A. F. et al., Investigation of thermal properties of ruthenium(III) B-diketonate precursors for preparation of RuO2 films by CVD, Journal of Thermal Analysis, vol. 46 (1996) pp. 1551-1565.

European Patent Office, International Search Report and Written Opinion of corresponding PCT Application No. PCT/US2009/031414, dated Apr. 29, 2009, 14 pp.

European Patent Office, International Search Report and Written Opinion of corresponding PCT Application No. PCT/IB2009/050910, dated Jul. 2, 2009, 15 pp.

* cited by examiner

VOID-FREE COPPER FILLING OF RECESSED FEATURES FOR SEMICONDUCTOR DEVICES

CROSS REFERENCE TO RELATED APPLICATIONS

The present invention is related to U.S. patent application Ser. No. 11/693,298, filed Mar. 29, 2007 and entitled METHOD OF FORMING LOW-RESISTIVITY COPPER FILM STRUCTURES, the entire content of which is incorporated herein by reference in its entirety.

FIELD OF THE INVENTION

The invention relates to semiconductor devices, and more particularly to processing methods for void-free copper (Cu) filling of recessed features containing a ruthenium (Ru) film.

BACKGROUND OF THE INVENTION

An integrated circuit contains various semiconductor devices and a plurality of conducting metal paths that provide electrical power to the semiconductor devices and allow these semiconductor devices to share and exchange information. Within an integrated circuit, metal layers are stacked on top of one another using intermetal or interlayer dielectric layers that insulate the metal layers from each other. Normally, each metal layer must form an electrical contact to at least one additional metal layer. Such electrical contact is achieved by etching a hole (i.e., a via) in the interlayer dielectric that separates the metal layers, and filling the resulting via with a metal to create an interconnect structure. Metal layers typically occupy etched pathways in the interlayer dielectric. A "via" normally refers to any recessed feature such as a hole, line or other similar feature formed within a dielectric layer that provides an electrical connection through the dielectric layer to a conductive layer underlying the dielectric layer. Similarly, recessed features containing metal layers connecting two or more vias are normally referred to as trenches.

A long-recognized objective in the constant advancement of integrated circuit (IC) technology is the scaling down of IC dimensions. Such scale down of IC dimensions reduces area capacitance and is critical to obtaining higher speed performance of ICs. Moreover, reducing the area of an IC die leads to higher yield in IC fabrication. These advances are driving forces to constantly scale down IC dimensions. An increase in device performance is normally accompanied by a decrease in device area or an increase in device density. An increase in device density requires a decrease in via dimensions used to form interconnects, including a larger aspect ratio (i.e., depth to width ratio). As the minimum feature dimensions on patterned substrates (wafers) steadily decreases, several consequences of this downward scaling are becoming apparent. For example, the recessed features are becoming so small that voids in bulk metal filling of the recessed features are unacceptable. As the width of metal lines are scaled down to smaller submicron and even nanometer dimensions, electromigration failure, which may lead to open and extruded metal lines, is now a well-recognized problem. Moreover, as dimensions of metal lines further decrease, metal line resistivity increases substantially, and this increase in line resistivity may adversely affect circuit performance.

The introduction of Cu metal into multilayer metallization schemes for manufacturing integrated circuits is enabled by the damascene Cu plating process and is now extensively used by manufacturers of advanced microprocessors and application-specific circuits. However, Cu metal cannot be put in direct contact with dielectric materials since Cu metal has poor adhesion to the dielectric materials and Cu is known to easily diffuse into common integrated circuit materials such as silicon and dielectric materials where Cu is a mid-bandgap impurity. Furthermore, oxygen can diffuse from an oxygen-containing dielectric material into Cu, thereby decreasing the electrical conductivity of the Cu metal. Therefore, a diffusion barrier material is formed on dielectric materials and other materials in the integrated circuits to surround the Cu metal and prevent diffusion of the Cu into the integrated circuit materials.

A tantalum nitride/tantalum (TaN/Ta) bilayer is commonly used as a diffusion barrier/adhesion layer for Cu metallization since the TaN barrier layer adheres well to oxides and provides a good barrier to Cu diffusion and the Ta adhesion layer wets well to both TaN on which it is formed and to the Cu metal formed over it. However, Ta is normally deposited by sputtering or plasma processing methods which are unable to provide conformal coverage over high aspect ratio recessed features. Ruthenium (Ru) has been suggested to replace the Ta adhesion layer since it may be conformally deposited and it adheres well to TaN and to Cu metal. However, Cu metallization structures containing Ru metal films have generally showed higher Cu resistivity than those containing the traditional TaN/Ta bilayers and oxidation of the Ru metal films during processing can result in voids and incomplete bulk Cu metal fill in the recessed features, thereby increasing the electrical resistance and adversely affecting the reliability of the semiconductor device.

Therefore, new processing methods are needed for forming low-resistivity film structures containing bulk Cu metal and Ru metal films.

SUMMARY OF THE INVENTION

A method is provided for void-free Cu filling of recessed features in semiconductor devices. The recessed features can include vias and trenches traditionally found in integrated circuits.

According to one embodiment of the invention, the method includes providing a patterned substrate containing a recessed feature, depositing a barrier film on the substrate, including in the recessed feature, depositing a Ru metal film on the barrier film, depositing a discontinuous Cu seed layer on the Ru metal film, the discontinuous Cu seed layer partially covering the Ru metal film in the recessed feature. The method further includes exposing the substrate to an oxidation source gas that oxidizes the Cu seed layer and a portion of the Ru metal film not covered by the Cu seed layer, heat-treating the oxidized Cu seed layer and the oxidized portion of the Ru metal film under high vacuum conditions or in the presence of an inert gas but not $H_2$ gas to activate the oxidized portion of the Ru metal film for Cu plating, and filling the recessed feature with bulk Cu metal.

DETAILED DESCRIPTION OF SEVERAL EMBODIMENTS OF THE INVENTION

Method for void-free Cu filling of recessed features in semiconductor devices is disclosed in several embodiments. The current inventors have studied different process variations and heat-treating processes that affect Cu voiding in recessed features containing a barrier film, a conformal Ru metal film on the barrier film, and bulk Cu metal filling the recessed feature. Cu voiding is a problem that is encountered due to oxidation of the Ru metal film during air exposure of about 2 hours or more prior to bulk Cu metal filling using a Cu plating process. Such air exposure is common in device manufacturing environments. Embodiments of the invention enable device manufacturers to integrate Ru metal films with void-free Cu filling of the recessed features. The Ru metal films can be deposited with excellent conformality and can provide greatly improved bulk Cu metal filling of high-aspect ratio recessed features.

One skilled in the relevant art will recognize that the various embodiments may be practiced without one or more of the specific details, or with other replacement and/or additional methods, materials, or component. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Furthermore, it is understood that the various embodiments shown in the figures are illustrative representations and are not necessary drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention.

Figure 1A:
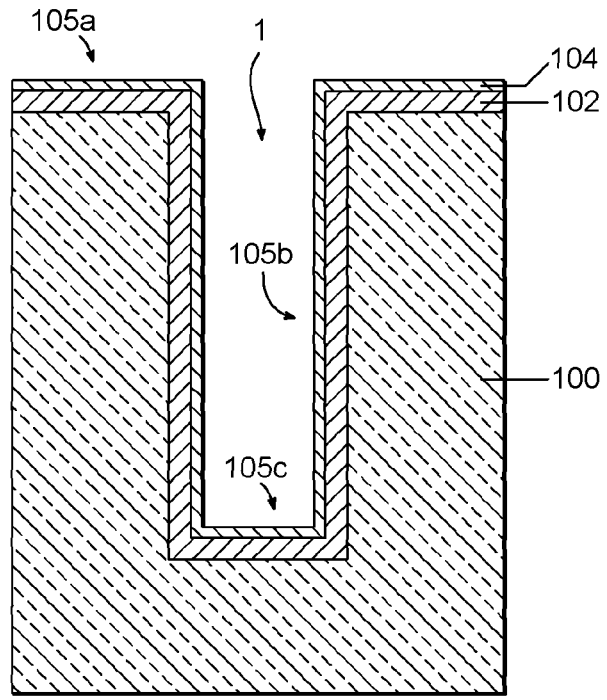
FIGS. 1A-1E schematically show cross-sectional views of a conventional process for Cu filling of a recessed feature.

FIGS. 1A-1E schematically show cross-sectional views of a conventional process for Cu filling of a recessed feature. FIG. 1A shows a patterned substrate 100, for example a Si substrate or a dielectric material. The dielectric material may contain $SiO_2$, SiON, SiN, or a low dielectric constant (low-k) material having a dielectric constant less than that of $SiO_2$ (k~3.9). Common low-k materials can contain simple or complex compounds of Si, O, N, C, H, or halogens, either as dense or porous materials. A recessed feature 1 is formed in the patterned substrate 100. The recessed feature 1 can, for example, be a via having an aspect ratio (depth/width) greater than or equal to about 2:1, for example 3:1, 4:1, 5:1, 6:1, 12:1, 15:1, or higher. The via can have a width of about 200 nm or less, for example 150 nm, 100 nm, 65 nm, 45 nm, 32 nm, 22 nm, or less. However, embodiments of the invention are not limited to these aspect ratios or via widths, as other aspect ratios and via widths may be utilized. Processing methods for forming the patterned substrate 100 depicted in FIG. 1A are well known to one skilled in the art.

FIG. 1A further shows a barrier film 102 formed on the patterned substrate 100, including in the recessed feature 1. The barrier film 102 can, for example, include a tantalum(Ta)-containing film (e.g., TaN, TaC, or TaCN), a titanium(Ti)-containing film (e.g., TiN, TiC, or TiCN), or a tungsten(W)-containing film (e.g., WN, WC, or WCN), or a combination thereof. The combination may include two or more separate TaN, TiN, and WN films, for example TaN/TiN or TaN/WN. A thickness of the barrier film 102 can, for example, be between about 1 nm (nm=$10^{-9}$ m) and about 10 nm, or between about 2 nm and about 5 nm, for example about 4 nm. The barrier film 102 may be deposited by a variety of different deposition methods known by one of ordinary skill in the art, including, but not limited to, chemical vapor deposition (CVD), pulsed CVD, plasma-enhanced CVD (PECVD), atomic layer deposition (ALD), plasma-enhanced ALD (PEALD), or sputtering methods. According to one embodiment of the invention, the barrier film 102 may be deposited by a non-plasma process, e.g., CVD, pulsed CVD, or ALD, to avoid possible plasma damage during the deposition. Furthermore, non-plasma processes are usually better able to deposit conformal films than plasma processes, especially for patterned substrates containing high-aspect-ratio recessed features and structures.

A wide variety of Ta-, Ti-, and W-containing precursors may be utilized for depositing the barrier film 102. Representative examples of Ta-containing precursors include $Ta(NMe_2)_5$ (pentakis(dimethylamido)tantalum, PDMAT), $Ta(NEtMe)_5$ (pentakis(ethylmethylamido)tantalum, PEMAT), $(tBuN)Ta(NMe_2)_3$ (tert-butylimido tris(dimethylamido)tantalum, TBTDMT), $(tBuN)Ta(NEt_2)_3$ (tert-butylimido tris(diethylamido)tantalum, TBTDET), $(tBuN)Ta(NEtMe)_3$ (tert-butylimido tris(ethylmethylamido)tantalum, TBTEMT), $(EtMe_2CN)Ta(NMe_2)_3$ (tert-amylimido tris(dimethylamido)tantalum, TAIMATA), $(iPrN)Ta(NEt_2)_3$ (iso-propylimido tris(diethylamido)tantalum, IPTDET), $Ta_2(OEt)_{10}$ (tantalum penta-ethoxide, TAETO), $(Me_2NCH_2CH_2O)Ta(OEt)_4$ (dimethylaminoethoxy tantalum tetra-ethoxide, TAT-DMAE), and $TaCl_5$ (tantalum pentachloride). Representative examples of Ti-containing precursors include $Ti(NEt_2)_4$ (tetrakis(diethylamido)titanium, TDEAT), $Ti(NMeEt)_4$ (tetrakis(ethylmethylamido)titanium, TEMAT), $Ti(NMe_2)_4$ (tetrakis(dimethylamido)titanium, TDMAT), $Ti(THD)_3$ (tris(2,2,6,6-tetramethyl-3,5-heptanedionato)titanium), and $TiCl_4$ (titanium tetrachloride). Representative examples of W-containing precursors include $W(CO)_6$ (tungsten hexacarbonyl), $WF_6$ (tungsten hexafluoride), and $(tBuN)_2W(NMe_2)_2$ (bis(tert-butylimido)bis(dimethylamido)tungsten, BTBMW). In the above precursors, as well as precursors described below, the following abbreviations are used: Me: methyl; Et: ethyl; iPr: isopropyl; tBu: tert-butyl; Cp: cyclopentadienyl; and THD: 2,2,6,6-tetramethyl-3,5-heptanedionate. In some examples, a nitrogen-containing gas such as ammonia ($NH_3$) or hydrazine ($N_2H_4$) may be utilized as a source of nitrogen when depositing the barrier film 102.

FIG. 1A further shows a Ru metal film 104 deposited on the barrier film 102, including on the field area 105a around the recessed feature 1, and on the sidewall 105b and bottom surface 105c of the recessed feature 1. A thickness of the Ru metal film 104 can, for example, be between about 0.5 nm and about 5 nm, or between about 1 nm and about 3 nm, for example about 2 nm. For example, the Ru metal film 104 may be deposited by a chemical vapor deposition (CVD) process at a substrate temperature of about 180-190° C. utilizing a $Ru_3CO_{12}$ precursor and a CO carrier gas. An exemplary Ru CVD process using a $Ru_3CO_{12}$ precursor and a CO carrier gas is described U.S. patent application Ser. No. 10/996,145, entitled METHOD AND DEPOSITION SYSTEM FOR INCREASING DEPOSITION RATES OF METAL LAYERS FROM METAL-CARBONYL PRECURSORS, the entire content of which is incorporated herein by reference. In another example, the Ru metal film 104 may be deposited by a CVD process utilizing a ruthenium metalorganic precursor. Exemplary ruthenium metalorganic precursors include (2,4-dimethylpentadienyl) (ethylcyclopentadienyl) ruthenium (Ru(DMPD)(EtCp)), bis(2,4-dimethylpentadienyl) ruthenium (Ru(DMPD)$_2$), 4-dimethylpentadienyl) (methylcyclopentadienyl) ruthenium (Ru(DMPD)(MeCp)), and bis(ethylcyclopentadienyl) ruthenium (Ru(EtCp)$_2$), as well as combinations of these and other precursors. Other examples for depositing the Ru metal film 104 include sputtering methods using a solid Ru metal target.

Figure 1B:
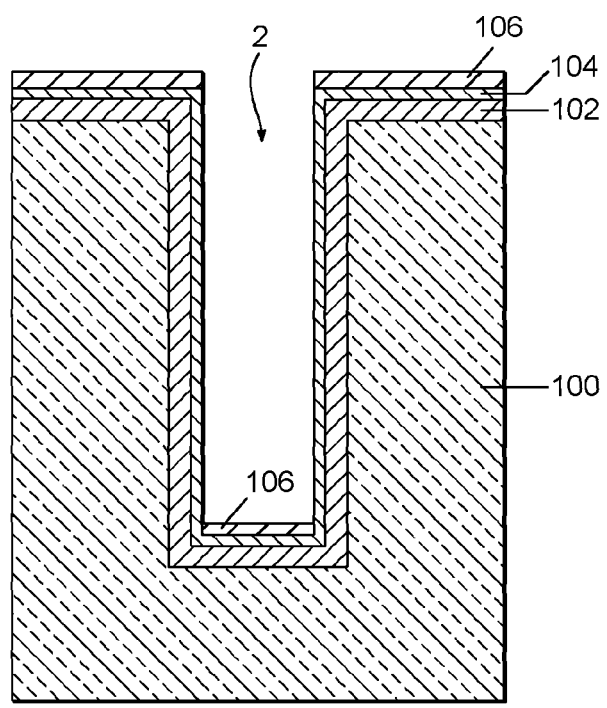

FIG. 1B shows a recessed feature 2 in which a Cu seed layer 106 is deposited on the Ru metal film 104 of recessed feature 1. The Cu seed layer 106 is discontinuous and may be deposited by a directional sputtering process (e.g., by ionized physical vapor deposition (IPVD)) from a solid Cu target. An exemplary IPVD system is described in U.S. Pat. No. 6,287,435, but other types of sputtering systems may be used. The directional character of the Cu sputtering process preferably deposits Cu metal on the field area 105a and on the bottom surface 105c, with little or no Cu deposited on the sidewall 105b. Although not shown in FIG. 1B, the Cu seed layer 106 may further contain discontinuous Cu islands on the sidewall 105b with exposed areas of the Ru metal film 104 between the discontinuous Cu islands. In one example, the Cu seed layer 106 may have very low step coverage, for example less than 10%. A thickness of Cu seed layer 106 on the field area 105a and on the bottom surface 105c can, for example, be between about 0.5 nm and about 50 nm, or between about 1 nm and about 20 nm, for example about 5 to 10 nm.

When used with the Ru metal film 104, the Cu seed layer 106 may be thinner than a conventional Cu seed layer used for Cu plating (e.g., a Cu seed layer on a Ta layer), where the Cu thickness is commonly greater than about 50 nm. Importantly, only a small amount of Cu needs to be deposited inside the recessed feature 2. In FIG. 1B, the Cu seed layer 106 is relatively thick on the field area 105a, thereby providing a low-resistivity path for conducting current from the substrate edge to the entire substrate surface. As those skilled in the art will readily recognize, the amount of Cu deposited in the recessed feature 2 will depend on the widths and depths of the recessed feature 2. Furthermore, since scaling of future semiconductor devices will continue to ever smaller minimum feature sizes, widths of recessed features will continue to decrease and depths will continue to increase. Therefore, the amount of the Cu inside the recessed features will continue to decrease. However, embodiments of the invention require little Cu to be deposited inside the recessed feature 2, thereby providing a method for successfully performing Cu metallization for the future scaling of semiconductor devices. A role of the discontinuous Cu seed layer 106 includes reducing the terminal ('resistive substrate') effect that is commonly encountered in electrochemical plating processing where a non-uniform thickness of the plated Cu layer over the whole substrate (wafer) is observed. The terminal effect is the tendency for the current density to be non-uniform as a result of the ohmic potential drop associated with conducting current from the substrate edge to the entire substrate surface through a thin resistive layer.

Further processing of the recessed feature 2 depicted in FIG. 1B includes bulk Cu metal filling of the recessed feature 2. Bulk Cu metal deposition processes are well known by one of ordinary skill in the art of circuit fabrication and can, for example, include an electrochemical plating process or an electroless plating process. During conventional processing, the patterned substrate 100 depicted in FIG. 1B is transferred in air to a Cu plating bath in a Cu plating system. During the transfer, the patterned substrate 100 is exposed to oxidation sources in the air, including water ($H_2O$) and oxygen ($O_2$). The air exposure may last a few hours and cause at least partial oxidation through a thickness of the Cu seed layer 106 and the portion of the Ru metal film 104 on the sidewall 105b that is not covered by the Cu seed layer 106.

Figure 1C:
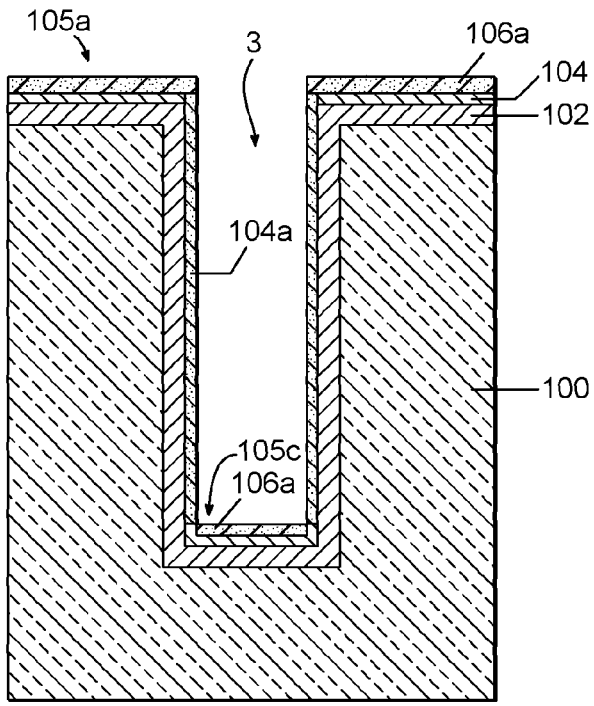
Figure 1D:
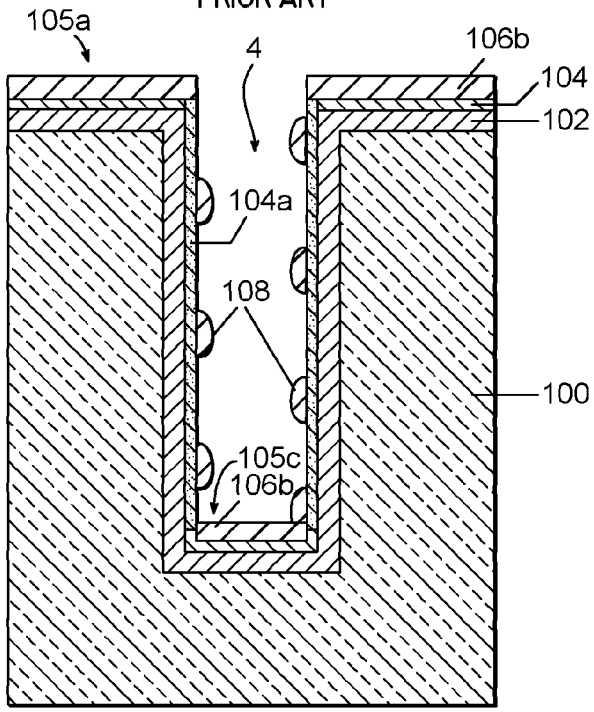
Figure 1E:
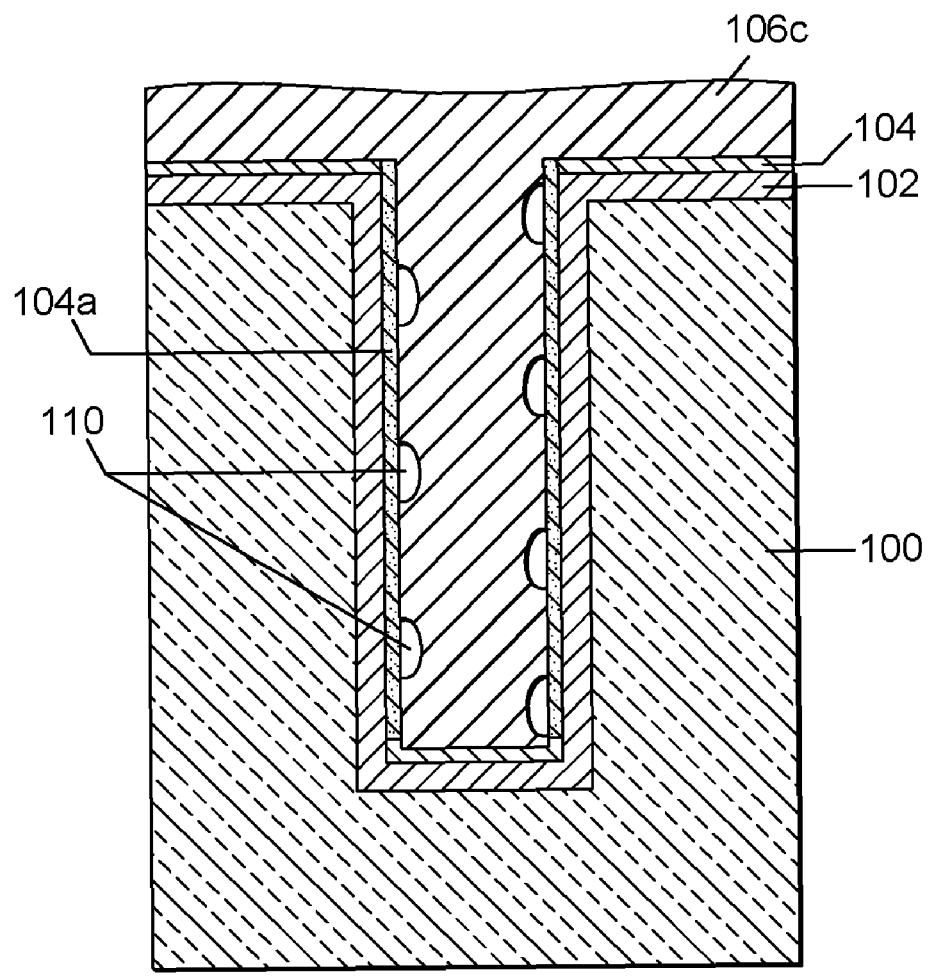

FIG. 1C schematically shows a recessed feature 3 having an oxidized Cu seed layer 106a and oxidized Ru metal film 104a following air exposure of the recessed feature 2. While any oxidized Cu is dissolved in the Cu plating bath during a subsequent Cu plating process and does therefore not cause a problem, the presence of the oxidized Ru metal film 104a in the recessed feature 3 has detrimental effect on bulk Cu metal filling of the recessed feature 3. This is schematically illustrated in FIGS. 1D and 1E. FIG. 1D schematically shows a recessed feature 4 in the initial stages of a Cu plating process that forms a plated Cu film 106b by depositing Cu on the field area 105a and on the bottom surface 105c, and deposits Cu seeds 108 on the oxidized Ru metal film 104a in the recessed feature 4. As shown in FIG. 1E, further Cu plating that fills the recessed feature 4 results in voids 110 on or near the oxidized Ru metal film 104a in the incomplete bulk Cu metal fill 106c. As is well known to those skilled in the art, the presence of the voids 110 in the incomplete bulk Cu metal fill 106c increases the electrical resistance and adversely affects the reliability of the semiconductor device.

Figure 2A:
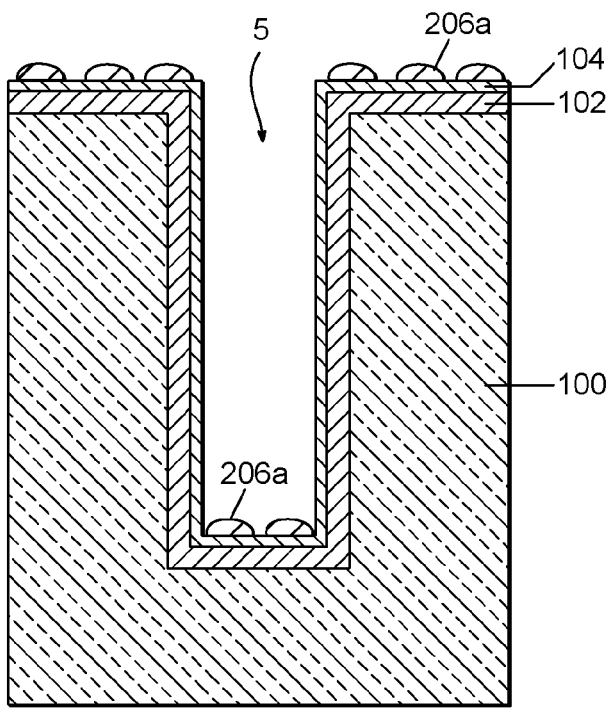
FIGS. 2A-2C schematically show cross-sectional views of another conventional process for Cu filling of a recessed feature.
Figure 2B:
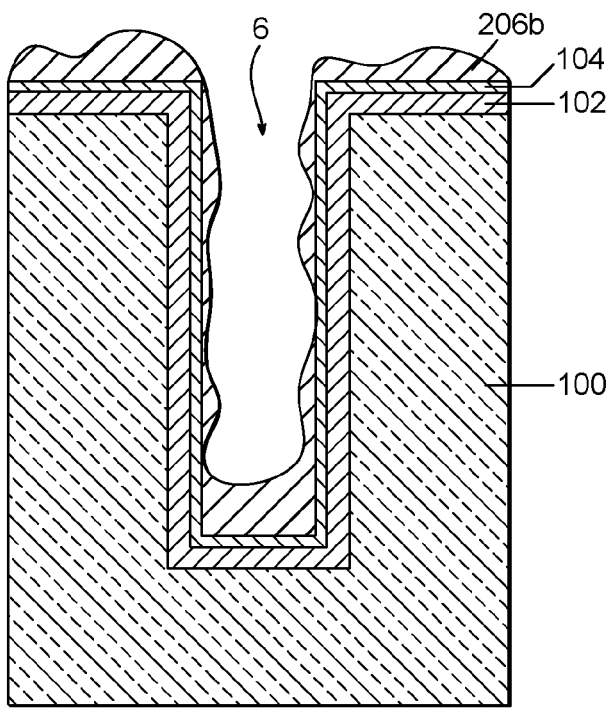
Figure 2C:
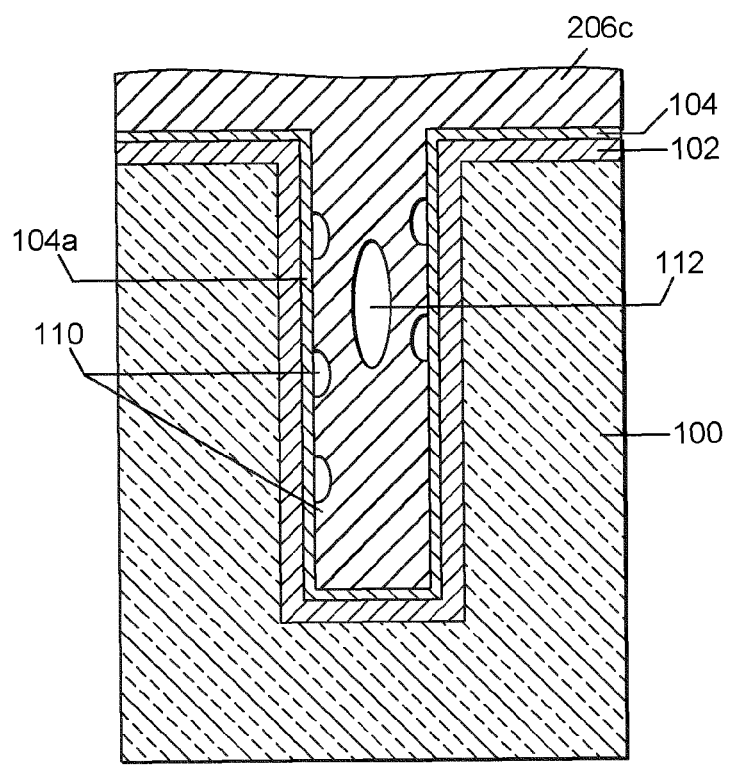

FIGS. 2A-2C schematically show cross-sectional views of another conventional process for Cu filling of a recessed feature. The approach depicted in FIGS. 2A-2C is similar to the approach depicted in FIGS. 1A-1E but further includes exposing the patterned substrate 100 in FIG. 1C to 5% $H_2$ gas in Ar gas to reverse the oxidation of the oxidized Ru metal film 104a and the oxidized Cu seed layer 106a prior to Cu plating. Further processing conditions included gas pressure of 9 Torr, substrate temperature of 260° C., gas exposure time of 10 minutes, $H_2$ gas flow rate of 50 standard cubic centimeters per minute (sccm), and Ar gas flow rate of 950 sccm. FIG. 2A shows a recessed feature 5 in the patterned substrate 100 following the exposure to $H_2$/Ar gas. The $H_2$/Ar exposure chemically reduces the oxidized Ru metal film 104a back to Ru metal film 104 but the $H_2$/Ar gas exposure also results in agglomeration of the oxidized Cu seed layer 106a to form Cu islands 206a on the field area 105a and on the bottom surface 105c of the recessed feature 5.

Figure 2D:
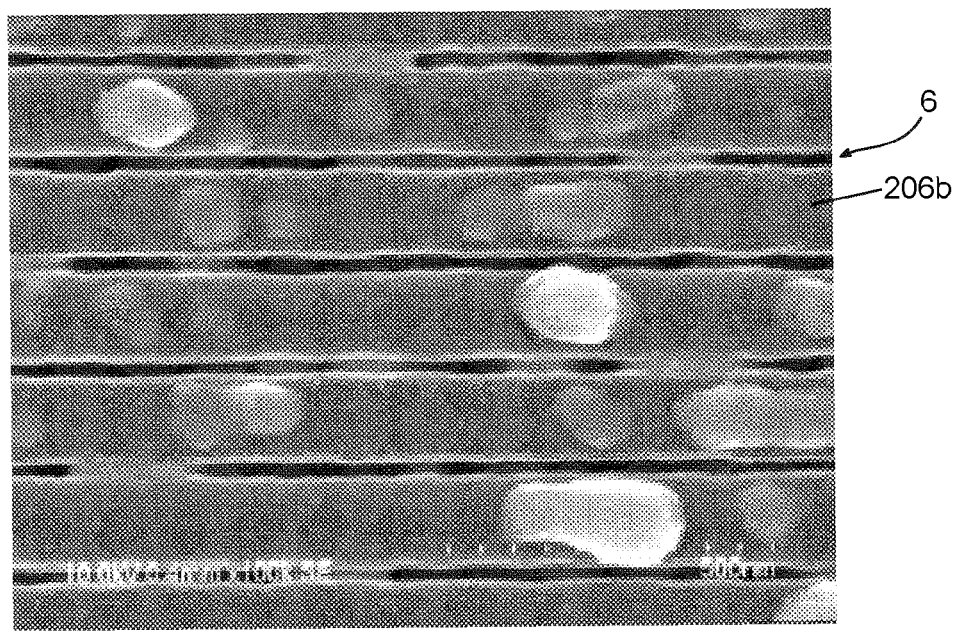
FIG. 2D is a top-view scanning electron micrograph (SEM) showing partially filled recessed features containing agglomerated Cu islands.

FIG. 2B shows initial stages of a Cu plating process that forms a recessed feature 6 containing a low-quality plated Cu layer 206b with a poor electrical current path for the Cu plating process. The poor electrical current path has detrimental effects on the bottom-up bulk Cu metal filling of the recessed feature 6. FIG. 2D is a top-view SEM showing partially filled recessed features 6 containing plated Cu layers 206b. As shown in FIG. 2C, further Cu plating that fills the recessed feature 6 results in voids 110 and a keyhole 112 in the incomplete bulk Cu metal fill 206c.

In view of the unacceptable bulk Cu metal filling of a recessed feature depicted in FIGS. 1A-1E for an un-treated oxidized Ru metal film and in FIGS. 2A-2C for $H_2$/Ar gas treated oxidized Ru metal film, the current inventors studied different process variations and heat-treatments that affect Cu voiding in recessed features. The current inventors have realized that heat-treating oxidized Ru metal films under high-vacuum conditions (i.e., gas pressure of about 1 mtorr, or lower) or in the presence of an inert gas such as Ar or $N_2$ but not $H_2$ gas can provide void-free Cu filling of high-aspect ratio recessed features. A gas pressure of the inert gas can, for example, be between about 0.1 Torr and about 760 Torr.

Figure 3A:
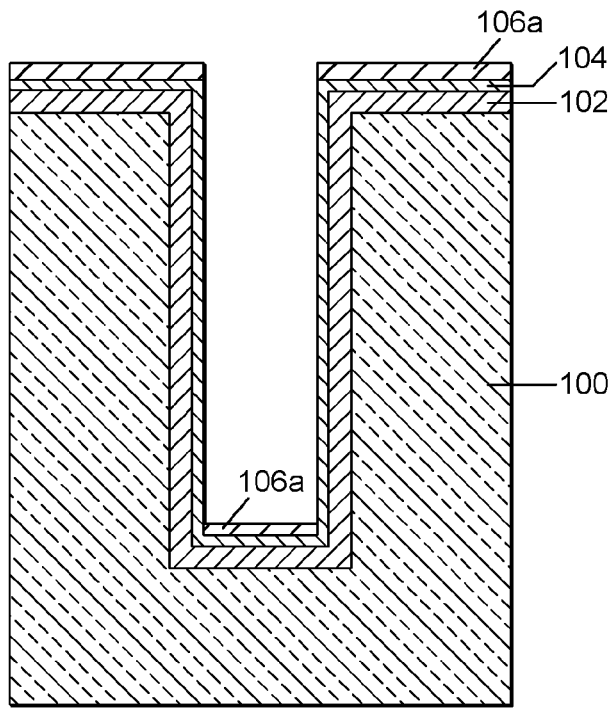
FIGS. 3A-3C schematically show cross-sectional views of void-free Cu filling of a recessed feature according to an embodiment of the invention.
Figure 3B:
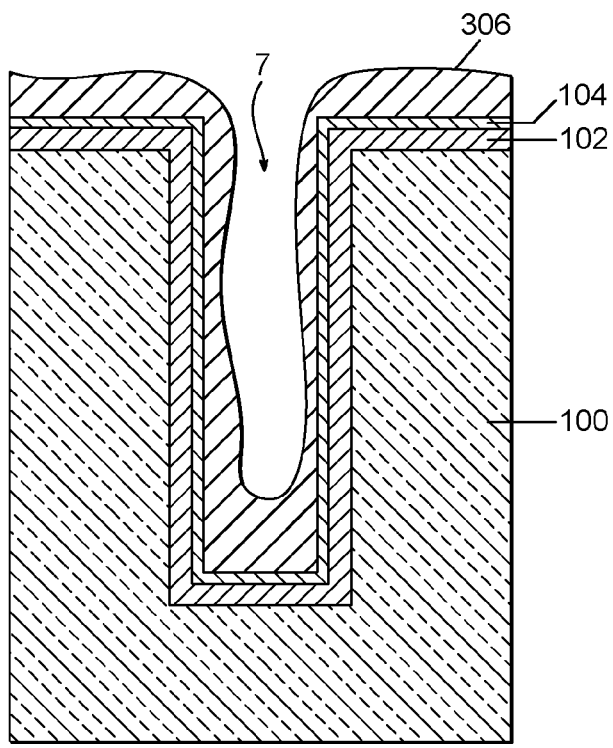
Figure 3C:
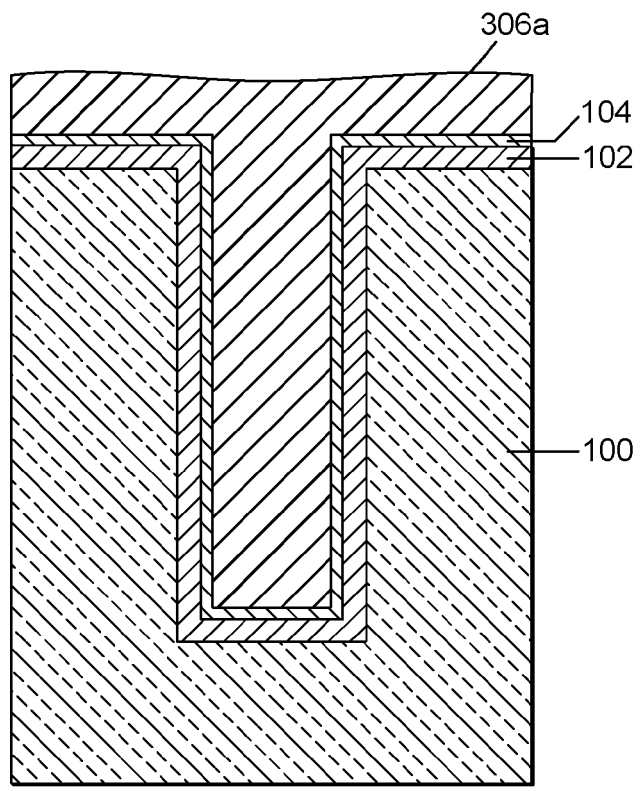
Figure 3D:
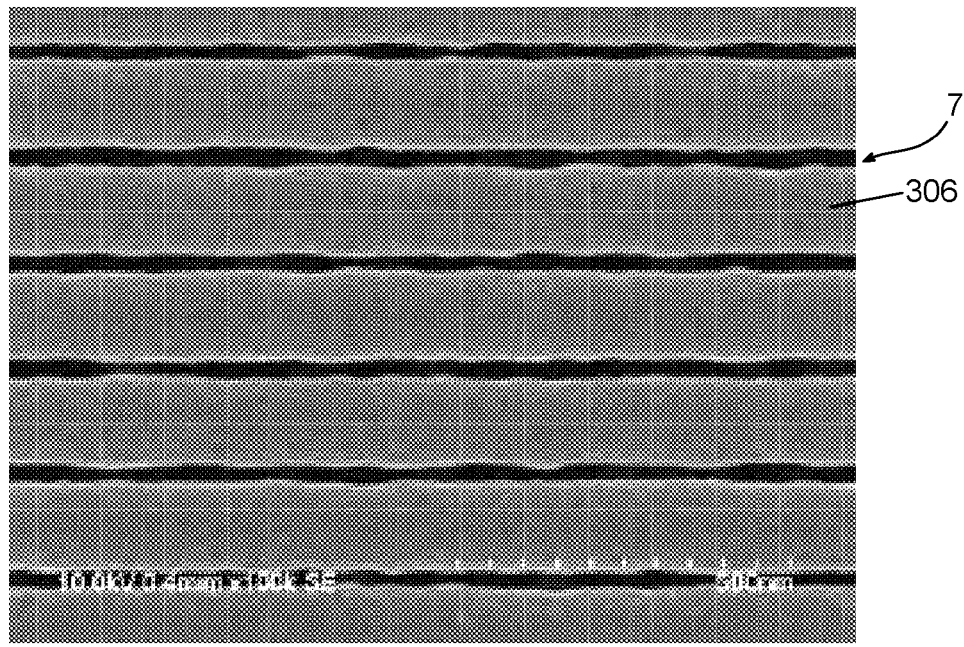
FIG. 3D is a top-view SEM showing partially filled recessed features.

FIGS. 3A-3C schematically show cross-sectional views of void-free Cu filling of a recessed feature according to an embodiment of the invention and FIG. 3D is a top-view SEM showing partially filled recessed features. The patterned substrate 100 in FIG. 1C was maintained at a temperature of 260° C. and exposed to an Ar gas. Further processing conditions included gas pressure of 9 Torr, substrate temperature of 260° C., and gas exposure time of 10 minutes. Substrate temperatures from 100° C. to 400° C. may be utilized, for example between 200° C. and 350° C., or between 250° C. and 300° C. In one example, void-free bulk Cu metal filling was observed for a substrate temperature of about 260° C. The heat-treating and Ar exposure activated the oxidized Ru metal film 104a to at least partially return it to Ru metal film 104 for subsequent Cu plating. The inventors believe that the heat-treating chemically reduced or desorbed at least a portion of the oxidized Ru metal film 104a, without chemically reducing the oxidized Cu seed layer 106a. As depicted in FIG. 3A, no Cu agglomeration was observed following the heat-treating and Ar exposure, unlike the Cu agglomeration observed following the $H_2$/Ar gas heat treatment depicted in FIG. 2A. The inventors believe that the oxidized Cu seed layer 106a reduces or prevents agglomeration of the Cu, due to the lower mobility of oxidized Cu compared to Cu metal. Furthermore, the heat-treating and Ar exposure reduced the electrical resistivity of the Ru metal film 104, thereby providing a good electrical current path in the subsequent Cu plating process.

FIG. 3B schematically shows initial stages of a Cu plating process that forms a recessed feature 7 containing a high-quality unagglomerated plated Cu layer 306 that provides a good electrical current path for a Cu plating process. FIG. 3D is a top-view SEM showing partially filled recessed features 7 and non-agglomerated plated Cu layer 306. Along with the Ru metal film 104, the plated Cu layer 306 enables formation of a void-free bulk Cu metal fill 306b, as shown in FIG. 3C. The inventors believe that the heat-treating reduces or desorbs at least a portion of the oxidized Ru metal film 104a, thereby regenerating Ru metal film 104. As shown in FIG. 3C, further Cu plating that fills the recessed feature 7 results in a void-free bulk Cu metal fill 306a.

Referring back to FIG. 1B, according to one embodiment of the invention, the Ru metal film 104 may be further heat-treated at a temperature between about 100° C. and about 400° C. prior to transferring the patterned structure for deposition of the Cu seed layer 106. During the heat-treating, the Ru metal film 104 may be exposed to $H_2$ gas, or a combination of an inert gas and $H_2$ gas, with or without a plasma. The inert gas can, for example, be selected from a noble gas and $N_2$. A combination of an inert gas and $H_2$ can, for example, include a $H_2$/Ar mixture. Combinations of $H_2$ and an inert gas can, for example, include 90% $H_2$ or less, for example 80%, 60%, 20%, 10%, 5%, or less, and balance inert gas. It is believed that the heat-treating effectively removes contaminants such are carbon and oxygen from the Ru metal film 104, thereby increasing the adhesion of Cu to the Ru metal film 104. An exemplary heat treatment of the Ru metal film 104 includes a gas pressure of 3 Torr and process time of 30 minutes, but embodiments of the invention are not limited by these processing conditions as other heat-treating conditions may be utilized. For example, the gas pressure can be between about 0.1 Torr and about 760 Torr. In some embodiments of the invention, the gas pressure can be between about 0.5 Torr and about 10 Torr.

According to another embodiment of the invention, following planarization of the bulk Cu metal fill 306a, the planarized bulk Cu metal may be heat-treated at a temperature between about 100° C. and about 400° C. following the Cu plating process to reduce the electrical resistivity of the bulk Cu metal. During the heat-treating, the bulk Cu metal fill 306a may be exposed to an inert gas, $H_2$, or a combination of an inert gas and $H_2$. The inert gas can, for example, be selected from a noble gas and $N_2$. A combination of an inert gas and $H_2$ can, for example, include a $H_2$/Ar mixture. Combinations of $H_2$ and an inert gas can, for example, include 90% $H_2$ or less, for example 80%, 60%, 20%, 10%, 5%, or less, and balance inert gas. An exemplary heat treatment of the planarized bulk Cu metal includes a gas pressure of 3 Torr and process time of 30 minutes, but embodiments of the invention are not limited by these processing conditions as other heat-treating conditions may be utilized. For example, the gas pressure can be between about 0.1 Torr and about 760 Torr. In some embodiments of the invention, the gas pressure can be between about 0.5 Torr and about 10 Torr.

Figure 4A:
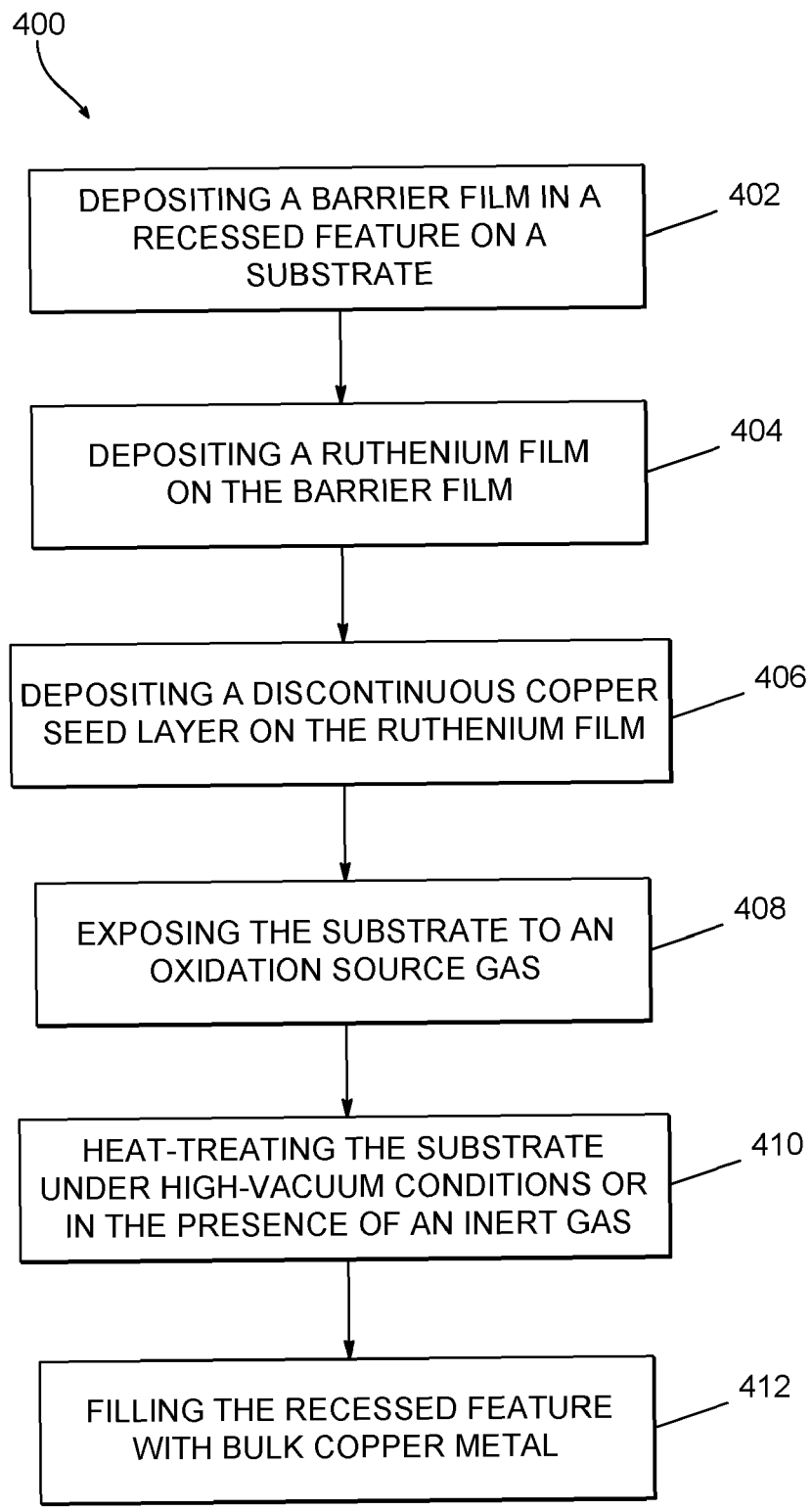
FIGS. 4A and 4B are process flow diagram for void-free Cu filling of a recessed feature according to embodiments of the invention.
Figure 4B:
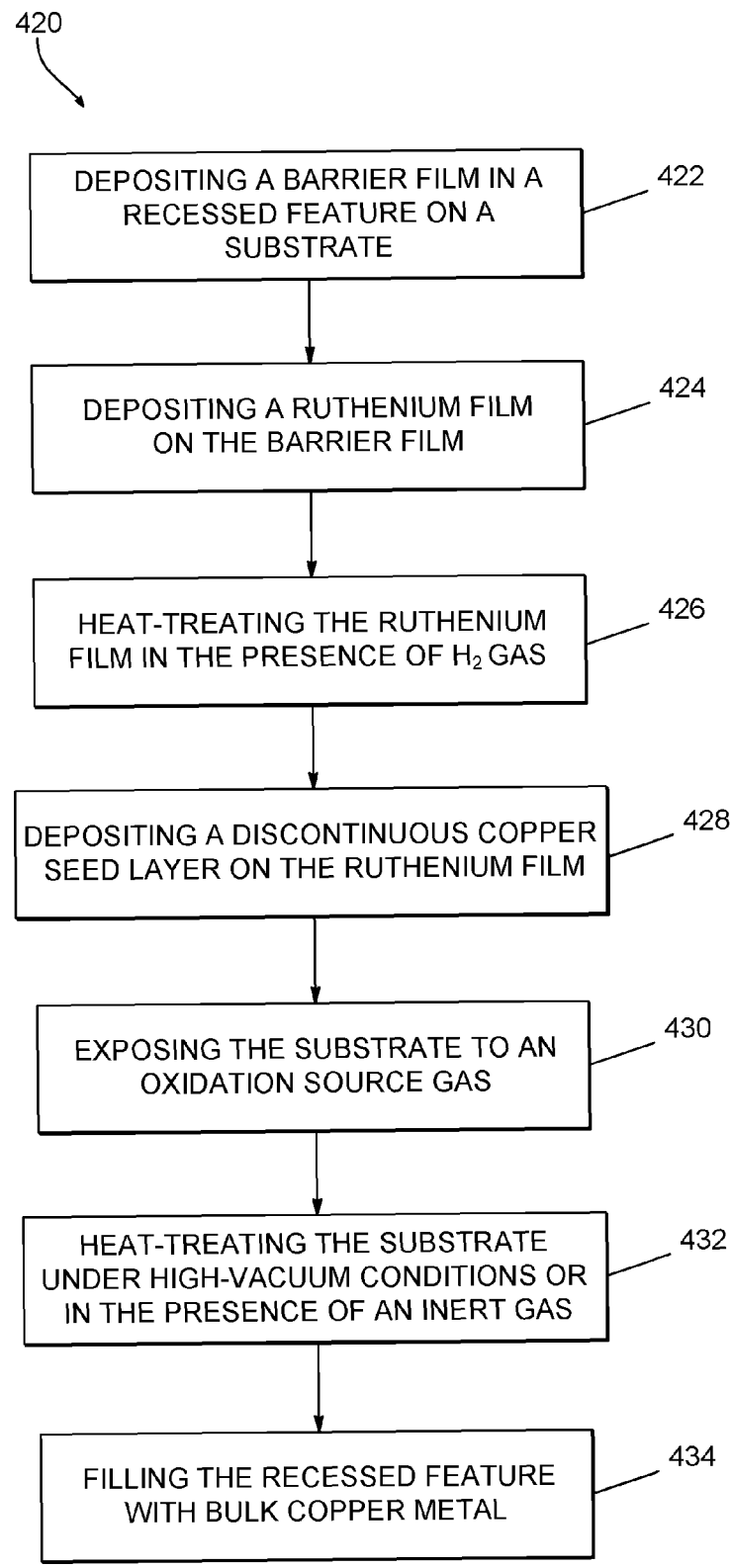

FIG. 4A-4B are process flow diagrams for void-free Cu filling of a recessed feature according to embodiments of the invention. The steps of the process flow diagrams in FIGS. 4A-4B have been described above. It should be noted that in this application, the term "step" does not prohibit two steps from being performed simultaneously or partially overlapping in time. For example, Ru deposition and heat-treating steps may be performed simultaneously or may partially overlap in time.

In FIG. 4A, the process 400 includes: in step 402, depositing a barrier film in a recessed feature on a substrate; in step 404, depositing a Ru metal film on the barrier film; in step 406, depositing a discontinuous Cu seed layer on the Ru metal film; in step 408, exposing the substrate to an oxidation source gas; in step 410, heat-treating the Ru metal film and the Cu seed layer under high-vacuum conditions or in the presence of an inert gas but not $H_2$ gas; and in step 412, filling the recessed feature with bulk Cu metal.

In FIG. 4B, the process 420 includes: in step 422, depositing a barrier film in a recessed feature on a substrate; in step 424, depositing a Ru metal film on the barrier film; in step 426, heat-treating the Ru metal film in an inert gas, $H_2$, or a combination of an inert gas and $H_2$, with or without a plasma; in step 428, depositing a discontinuous Cu seed layer on the Ru metal film; in step 430, exposing the substrate to an oxidation source gas; in step 432, heat-treating the patterned substrate under high vacuum conditions or in the presence of an inert gas but not $H_2$ gas; and in step 434, filling the recessed feature with bulk Cu metal.

Figure 5A:
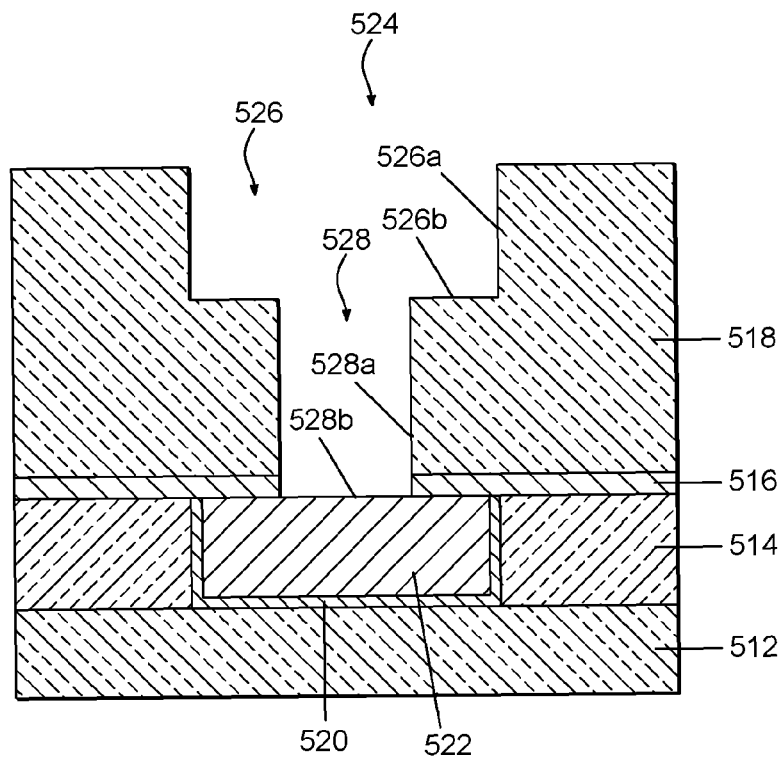
FIGS. 5A and 5B schematically show cross-sectional views of additional recessed features according to embodiments of the invention.
Figure 5B:
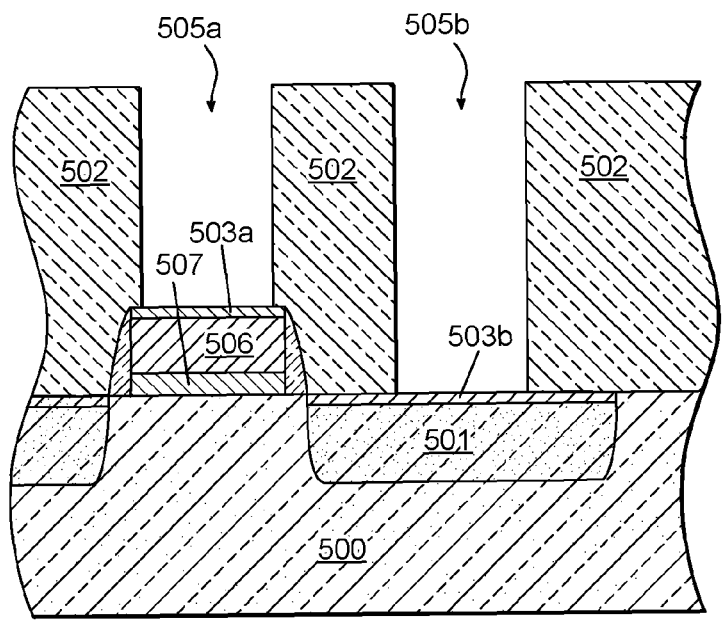

An exemplary recessed feature 1 was illustrated and described above in FIG. 1A, but embodiments of the invention may be applied to other types of recessed features found in integrated circuit design. FIGS. 5A-5B schematically show cross-sectional views of other recessed features according to additional embodiments of the invention. As will be appreciated by one of ordinary skill in the art, embodiments of the invention can be readily applied to the recessed features depicted in FIGS. 5A and 5B.

FIG. 5A schematically shows a cross-sectional view of a dual damascene interconnect structure. Dual damascene interconnect structures are well known by one of ordinary skill in the art of integrated circuit fabrication. The dual damascene interconnect structure depicted in FIG. 5A contains a dual damascene interconnect recessed feature 524 formed over a conductive interconnect structure 522. The dual damascene interconnect recessed feature 524 contains a via 528 having sidewall and bottom surfaces 528a and 528b, respectively, and a trench 526 formed in dielectric material 518, where the trench 526 contains sidewall and bottom surfaces 526a and 526b, respectively. The trench 526 may be used for an upper conductive interconnect structure and the via 528 connects the trench 526 to the conductive interconnect structure 522. The interconnect structure further contains dielectric layers 512 and 514, barrier film 520 surrounding the conductive interconnect structure 522, and etch stop layer 516. According to one embodiment, following deposition of a barrier film in the dual damascene interconnect feature 524, at least a portion of the barrier film may be removed by plasma etching from the bottom surface 528b prior to depositing a Ru metal film in the dual damascene interconnect recessed feature 524. The plasma etching provides for directly contacting the Ru metal film to the conductive interconnect structure 522. According to another embodiment, at least a portion of the barrier film and the Ru metal film may be removed by plasma etching from the bottom surface 528b, thereby providing for directly contacting a bulk Cu metal fill in the dual damascene interconnect recessed feature 524 to the conductive interconnect structure 522.

FIG. 5B schematically shows a cross-sectional view of a patterned structure according to another embodiment of the invention. The patterned structure contains a recessed feature 505a formed in a dielectric film 502 and a conductive layer 503a formed on a gate electrode 506 at the bottom of the recessed feature 505a. The gate electrode 506 is part of a gate structure that further contains a gate dielectric film 507. The gate dielectric film 507 can contain $SiO_2$, $SiO_xN_y$, $SiN_y$, or a high dielectric constant (high-k) material having a dielectric constant greater than that of $SiO_2$ (k~3.9), or a combination thereof. High-k materials can include metal oxides, metal oxynitrides, and their silicates, for example $Ta_2O_5$, $TiO_2$, $ZrO_2$, $Al_2O_3$, $Y_2O_3$, $HfO_xN_y$, $HfSiO_xN_y$, $HfSiO_x$, $HfO_2$, $ZrO_2$, $ZrSiO_x$, $ZrO_xN_y$, $ZrSiO_xN_y$, $TaSiO_x$, $SrO_x$, $SrSiO_x$, $LaO_x$, $LaSiO_x$, $YO_x$, $YSiO_x$, or $BaO$, or combinations of two or more thereof.

Furthermore, the patterned structure in FIG. 5B contains a recessed feature 505b formed in the dielectric film 502 and a conductive layer 503b formed on a doped substrate region 501 (e.g., a drain or a source region) in the substrate 500 at the bottom of the recessed feature 505b. The substrate 500 can, for example, be a 200 mm Si wafer, a 300 mm Si wafer, or an even larger Si wafer. The dielectric film 502 can contain $SiO_2$, SiON, SiN, or a low dielectric constant (low-k) material having a dielectric constant less than that of $SiO_2$ (k~3.9). Common low-k materials can contain simple or complex compounds of Si, O, N C, H, and/or halogens, either as dense or porous materials. According to an embodiment of the invention, the recessed features 505a, 505b can be vias with aspect ratios (depth/width) greater than or equal to about 2, for example 3, 4, 5, 6, 7, 12, 15, or higher. The vias can have widths of about 200 nm or less, for example 150 nm, 100 nm, 65 nm, 45 nm, 32 nm, 20 nm, or lower. In one example, the recessed features 505a, 505b can be 45 nm wide vias with aspect ratios of about 7. However, embodiments of the invention are not limited to these aspect ratios or via widths, as other aspect ratios or via widths may be utilized. The conductive layers 503a and 503b can include silicide contact layers that provide thin stable electrical contacts and can, for example, contain $CoSi_2$, $PtSi$, $Pd_2Si$, $TiSi_2$, $WSi_2$, $NiSi_2$, or $TaSi_2$, or a combination of two or more thereof. One combination may contain PtNiSi that allows the use of higher processing temperatures than $NiSi_2$. Processing methods for forming the patterned structures depicted in FIGS. 5A and 5B are well known to one skilled in the art.

A plurality of embodiments for void-free Cu filling of recessed features in semiconductor devices has been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a patterned substrate is directly on and in immediate contact with the substrate; there may be a second film or other structure between the film and the patterned substrate.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method for forming a semiconductor device, the method comprising:
    providing a patterned substrate containing a recessed feature;
    depositing a barrier film on the substrate, including in the recessed feature;
    depositing a Ru metal film on the barrier film;
    depositing a discontinuous Cu seed layer on the Ru metal film, the Cu seed layer partially covering the Ru metal film in the recessed feature;
    exposing the substrate to an oxidation source gas that oxidizes the Cu seed layer and a portion of the Ru metal film not covered by the Cu seed layer;
    heat-treating the oxidized Cu seed layer and the oxidized portion of the Ru metal film (a) under high vacuum conditions including a gas pressure of 1 mTorr or less or (b) in the presence of an inert gas but not $H_2$ gas, wherein the heat-treating activates the oxidized portion of the Ru metal film for Cu plating without chemically reducing the oxidized Cu seed layer; and
    thereafter, filling the recessed feature with bulk Cu metal.

2. The method of claim 1, wherein the inert gas comprises a noble gas or $N_2$.

3. The method of claim 1, wherein the heat-treating further comprises
    maintaining the substrate at temperature between about 100° C. and about 400° C.

4. The method of claim 1, wherein the Cu seed layer is sputter deposited from a solid Cu target.

5. The method of claim 1, wherein the barrier film comprises TaN, TaC, TaCN, TiN, TiC, TiCN, WN, WC, or WCN, or a combination thereof.

6. The method of claim 1, wherein the recessed feature comprises a via, a trench, or a combination thereof.

7. The method of claim 1, further comprising:
    prior to depositing the discontinuous Cu seed layer, heat-treating the Ru metal film at a temperature between about 100° C. and about 400° C. in the presence of $H_2$ gas or a combination of an inert gas and $H_2$ gas.

8. The method of claim 7, further comprising:
    heat-treating the bulk Cu metal at a temperature between about 100° C. and about 400° C. in the presence of $H_2$ gas or a combination of an inert gas and $H_2$ gas.

9. The method of claim 1, further comprising:
heat-treating the bulk Cu metal at a temperature between about 100° C. and about 400° C. in the presence of $H_2$ gas or a combination of an inert gas and $H_2$ gas.

10. The method of claim 1, wherein the patterned substrate comprises the recessed feature formed within a dielectric material.

11. The method of claim 1, further comprising:
at least partially removing the barrier film from a bottom surface of the recessed feature prior to depositing the Ru metal film.

12. The method of claim 1, further comprising:
at least partially removing the barrier film and the Ru metal film from a bottom surface of the recessed feature prior to the filling.

13. The method of claim 1, wherein depositing the Ru metal film comprises: exposing the patterned substrate to a process gas containing $Ru_3(CO)_{12}$ and CO.

14. The method of claim 1, wherein the filling comprises an electrochemical plating process or an electroless plating process.

15. A method for forming a semiconductor device, the method comprising:
providing a patterned substrate containing a first recessed feature formed within a dielectric material;
depositing a TaN or TaCN barrier film on the substrate, including in the first recessed feature;
depositing a Ru metal film on the barrier film by exposing the patterned substrate to a process gas containing $Ru_3(CO)_{12}$ and CO;
depositing a discontinuous Cu seed layer on the Ru metal film by sputter deposition, the Cu seed layer partially covering Ru metal film on a side wall in the first recessed feature;
oxidizing the Cu seed layer and a portion of the Ru metal film not covered by the Cu seed layer by exposure to air;
heat-treating the oxidized Cu seed layer and the oxidized portion of the Ru metal film (a) under high vacuum conditions including a gas pressure of 1 mTorr or less or (b) in the presence of an inert gas but not $H_2$ gas, wherein the heat-treating activates the oxidized portion of the Ru metal film for Cu plating without chemically reducing the oxidized Cu seed layer; and
thereafter, filling the first recessed feature with bulk Cu metal in an electrochemical plating process or an electroless plating process.

16. The method of claim 15, further comprising:
prior to depositing the discontinuous Cu seed layer, heat-treating the Ru metal film at a temperature between about 100° C. and about 400° C. in the presence of $H_2$ gas or a combination of an inert gas and $H_2$ gas.

17. The method of claim 15, wherein the recessed feature comprises a via, a trench, or a combination thereof.

18. The method of claim 15, further comprising:
at least partially removing the barrier film from a bottom surface of the recessed feature prior to depositing the Ru metal film.

19. The method of claim 15, further comprising:
at least partially removing the barrier film and the Ru metal film from a bottom surface of the recessed feature prior to the filling.

20. The method of claim 15, wherein the patterned substrate contains and a first conductive layer formed on a gate electrode at the bottom of the first recessed feature, the patterned substrate further containing a second recessed feature formed in the dielectric material and a second conductive layer formed on a doped substrate region in the patterned substrate at the bottom of the second recessed feature, and wherein the steps of the method are performed in each of the first and second recessed features whereby the barrier film is deposited on the dielectric material and on the first and second conductive layers.

* * * * *

UNITED STATES PATENT AND TRADEMARK OFFICE
CERTIFICATE OF CORRECTION

| | |
|---|---|
| PATENT NO. | : 7,884,012 B2 |
| APPLICATION NO. | : 11/864566 |
| DATED | : February 8, 2011 |
| INVENTOR(S) | : Kenji Suzuki et al. |

It is certified that error appears in the above-identified patent and that said Letters Patent is hereby corrected as shown below:

Col. 1, line 57, "width of metal lines are scaled" should read --width of metal lines is scaled--.

Col. 3, line 6, "process flow diagram" should read --process flow diagrams--.

Col. 3, line 43, "not necessary drawn" should read --not necessarily drawn--.

Col. 5, line 4, "described U.S. patent" should read --described in U.S. patent--.

Col. 8, line 24, "FIG. 4A-4B" should read --FIGS. 4A-4B--.

Col. 12, line 27, Claim 20, "contains and a first" should read --contains a first--.

Signed and Sealed this
Nineteenth Day of April, 2011

David J. Kappos
*Director of the United States Patent and Trademark Office*